(12) United States Patent
Watanabe et al.

(10) Patent No.: US 10,490,692 B2
(45) Date of Patent: Nov. 26, 2019

(54) SEMICONDUCTOR LIGHT-EMITTING DEVICE AND DISPLAY APPARATUS

(71) Applicant: SONY CORPORATION, Tokyo (JP)

(72) Inventors: Yoshiaki Watanabe, Kanagawa (JP); Takayuki Kawasumi, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/551,774

(22) PCT Filed: Dec. 25, 2015

(86) PCT No.: PCT/JP2015/006473
§ 371 (c)(1),
(2) Date: Aug. 17, 2017

(87) PCT Pub. No.: WO2016/139708
PCT Pub. Date: Sep. 9, 2016

(65) Prior Publication Data
US 2018/0033910 A1  Feb. 1, 2018

(30) Foreign Application Priority Data
Mar. 3, 2015  (JP) .................. 2015-041570

(51) Int. Cl.
*H01L 33/00* (2010.01)
*H01L 33/14* (2010.01)
(Continued)

(52) U.S. Cl.
CPC ......... *H01L 33/0045* (2013.01); *G09G 3/002* (2013.01); *G09G 3/025* (2013.01);
(Continued)

(58) Field of Classification Search
None
See application file for complete search history.

(56) References Cited

U.S. PATENT DOCUMENTS

| | | | |
|---|---|---|---|
| 4,376,946 A | 3/1983 | Kaminow et al. | |
| 8,786,941 B2 * | 7/2014 | Kuramoto | H01S 5/1064 359/344 |

(Continued)

FOREIGN PATENT DOCUMENTS

| | | |
|---|---|---|
| CA | 1175131 A | 9/1984 |
| CN | 104009392 A | 8/2014 |

(Continued)

OTHER PUBLICATIONS

International Search Report and Written Opinion of PCT Application No. PCT/JP2015/006473, dated Feb. 16, 2016, 06 pages of English Translation and 07 pages of ISRWO.

(Continued)

*Primary Examiner* — Thien F Tran
(74) *Attorney, Agent, or Firm* — Chip Law Group (57) ABSTRACT

There is provided a semiconductor light-emitting device including a light-emitting edge, an opposite edge, and a first conductive layer that includes a current narrowing structure having a longitudinal direction along one direction from the opposite edge to the light-emitting edge. An active layer is between the first conductive layer and a second conductive layer which respectively come into contact with the first conductive layer and the second conductive layer. The current narrowing structure includes a spread area such that a width of the spread area in a direction along a surface of the first conductive layer widens from a predetermined position toward the light-emitting edge in the one direction. The first electrode layer includes an electrode area on at least the spread area such that a width thereof in the direction along the surface of the first conductive layer becomes smaller than the width of the spread area.

8 Claims, 9 Drawing Sheets

(51) Int. Cl.
*G09G 3/34* (2006.01)
*H01L 33/58* (2010.01)
*G09G 3/00* (2006.01)
*G09G 3/02* (2006.01)
*H01L 33/38* (2010.01)
*H01L 33/22* (2010.01)

(52) U.S. Cl.
CPC ........... *G09G 3/3406* (2013.01); *G09G 3/346* (2013.01); *H01L 33/14* (2013.01); *H01L 33/58* (2013.01); *G09G 2320/0626* (2013.01); *H01L 33/22* (2013.01); *H01L 33/38* (2013.01)

(56) References Cited

U.S. PATENT DOCUMENTS

| | | | | |
|---|---|---|---|---|
| 2005/0157767 | A1* | 7/2005 | Watanabe | B82Y 20/00 372/43.01 |
| 2010/0097678 | A1* | 4/2010 | Hajjar | G01J 3/506 359/198.1 |
| 2014/0239251 | A1 | 8/2014 | Hiroaki | |
| 2015/0041757 | A1 | 2/2015 | Fujii et al. | |
| 2015/0063392 | A1 | 3/2015 | Takayama | |

FOREIGN PATENT DOCUMENTS

| | | |
|---|---|---|
| CN | 104247176 A | 12/2014 |
| CN | 104348085 A | 2/2015 |
| DE | 3146795 A | 6/1982 |
| EP | 2770592 A2 | 8/2014 |
| FR | 2495383 A | 6/1982 |
| GB | 2090056 A | 6/1982 |
| IT | 1142073 B | 10/1986 |
| JP | 57-117285 A | 7/1982 |
| JP | 02-310975 A | 12/1990 |
| JP | 05-067845 A | 3/1993 |
| JP | 05-67845 A | 3/1993 |
| JP | 09-326504 A | 12/1997 |
| JP | 11-186659 A | 7/1999 |
| JP | 2006-114605 A | 4/2006 |
| JP | 2014-165328 A | 9/2014 |
| JP | 2014-170958 A | 9/2014 |
| JP | 5661220 B | 1/2015 |
| JP | 2015-035465 A | 2/2015 |
| JP | 2015-35465 A | 2/2015 |
| NL | 8105386 A | 6/1982 |
| WO | 2013/171950 A1 | 11/2013 |

OTHER PUBLICATIONS

International Preliminary Report on Patentability of PCT Application No. PCT/JP2015/006473, dated Sep. 14, 2017, 07 pages of English Translation and 04 pages of IPRP.

* cited by examiner

SEMICONDUCTOR LIGHT-EMITTING DEVICE AND DISPLAY APPARATUS

CROSS REFERENCE TO RELATED APPLICATIONS

This application is a U.S. National Phase of International Patent Application No. PCT/JP2015/006473 filed on Dec. 25, 2015, which claims priority benefit of Japanese Patent Application No. JP 2015-041570 filed in the Japan Patent Office on Mar. 3, 2015. Each of the above-referenced applications is hereby incorporated herein by reference in its entirety.

TECHNICAL FIELD

The present technology relates to a semiconductor light-emitting device and a display apparatus including the semiconductor light-emitting device.

BACKGROUND ART

As a semiconductor light-emitting device, a superluminescent diode (SLD) has characteristics of emitting, while having a wide emission spectrum width that is relatively close to that of a light-emitting diode, light with a narrow radiation angle and high intensity as in a semiconductor laser emission state at the same time.

An SLD described in Patent Literature 1 includes a linear ridge waveguide formed to be vertical to a cleavage edge surface in plan view and a bending guide active layer provided so as to be bent subsequent to the linear ridge waveguide. An AR (antireflection) film may be formed on the cleavage edge surface. In the SLD having such a structure, a large portion of light generated in an active layer right below the linear ridge waveguide travels toward the bending guide active layer. The light traveling toward the bending guide active layer is separated into light that leaks due to the bend, light that is guided to an edge surface (edge surface on other side of cleavage edge surface) and reflected by that edge surface, and light absorbed while being guided. According to such a structure, the light that leaks due to the bend and the light that is reflected by the opposite edge of the cleavage edge surface cannot return to the linear active layer, so laser mode oscillation is suppressed (see, for example, lower right-hand column on second page to upper left-hand column on third page, and FIGS. 1A and 1B).

In short, instead of a structure of causing light to reciprocate by mirrors provided on both edge surfaces to cause oscillation like a normal laser diode (LD), the SLD includes a structure of causing light to travel unidirectionally in the waveguide and amplifying the light (stimulated emission is performed). A point that differs between them is that a wavelength spectrum width of output light of the SLD is far wider than that of the LD.

A superluminescent diode disclosed in Patent Literature 2 includes a core of a light emitting optical waveguide corresponding to an area where an electrode is formed and a core of a light absorbing optical waveguide capable of absorbing light, that corresponds to an area where an electrode is not formed. This light absorbing optical waveguide core becomes wider from a connection portion with the light emitting optical waveguide core toward a read edge surface. With such a configuration, light emitted rearward (direction toward opposite edge side of light-emitting edge) from the light emitting optical waveguide core is absorbed by the light absorbing optical waveguide core, with the result that return light of reflected light from the rear edge surface is suppressed. Therefore, low coherency is realized (see, for example, paragraph [0012] in specification).

CITATION LIST

Patent Literature

Patent Literature 1: Japanese Patent Application Laid-open No. Hei 2-310975
Patent Literature 2: Japanese Patent Application Laid-open No. Hei 9-326504

DISCLOSURE OF INVENTION

Technical Problem

Incidentally, in a case of widening an application range of such a semiconductor light-emitting device, a high output is required in addition to a wide spectrum width.

In view of the circumstances as described above, the present technology aims at providing a semiconductor light-emitting device capable of raising an output while maintaining a wide emission spectrum width of the past, and a display apparatus including the semiconductor light-emitting device.

Solution to Problem

For attaining the object described above, a semiconductor light-emitting device according to an embodiment of the present technology is a semiconductor light-emitting device including a light-emitting edge and an opposite edge, and includes a first conductive layer, a second conductive layer, an active layer, a first electrode layer, and a second electrode layer.

The first conductive layer includes a current narrowing structure configured such that a current injection area is narrowed. A longitudinal direction of the current narrowing structure is provided along one direction from the opposite edge to the light-emitting edge.

The active layer is provided between the first conductive layer and the second conductive layer.

The first electrode layer and the second electrode layer are respectively provided in contact with the first conductive layer and the second conductive layer.

The current narrowing structure includes a spread area. The spread area is provided such that a width of the current narrowing structure in a direction along a surface of the first conductive layer widens from a predetermined position toward the light-emitting edge in the one direction.

The first electrode layer includes an electrode area. The electrode area is provided on at least the spread area such that a width thereof in the direction along the surface of the first conductive layer becomes smaller than the width of the spread area.

With such a configuration, it is possible to realize a high output while maintaining a wide emission spectrum width of the past. Particularly since the first electrode layer includes the spread electrode area having a width smaller than that of the spread area, efficiency of an interaction between currents and light can be raised, which contributes to a high output.

The electrode area of the first electrode layer may be a spread electrode area provided such that the width widens toward the light-emitting edge in the one direction.

Accordingly, it becomes possible to lower an optical energy density on the light-emitting edge side and avoid the vicinity of the light-emitting edge from becoming high in temperature.

An edge of the electrode area on the light-emitting edge side in the one direction may extend to the light-emitting edge.

Specifically, the edge of the spread area on the light-emitting edge side coinciding with the light-emitting edge contributes to high efficiency of an interaction between currents and light.

The current narrowing structure may include an area that is provided from the opposite edge to the predetermined position and includes a constant width smaller than the width of the spread area.

The spread area may extend from the opposite edge to the light-emitting edge.

When a spread angle of an optical waveguide below the spread area, that is formed in the active layer by the current narrowing structure, is represented by θ, θ=arctan [$\lambda$/($\pi w_0 n$)] may be satisfied. In this case, an optical wavelength is represented by $\lambda$, ½ a minimum width of the spread area in the direction along the surface is represented by $w_0$, and a refractive index of the active layer is represented by n.

The electrode area of the first electrode layer may include a width smaller than a width that is $1/e^2$ a peak intensity of light that passes an optical waveguide formed in the active layer by the current narrowing structure.

A semiconductor light-emitting device according to another embodiment of the present technology is a semiconductor light-emitting device including a light-emitting edge and an opposite edge, and includes a first conductive layer, a second conductive layer, an active layer, a first electrode layer, and a second electrode layer.

Particularly, the current narrowing structure includes a first area and a second area. The first area is provided from a first position to a second position in the one direction. The second area is provided from the second position to the light-emitting edge and includes a width larger than a width of the first area in a direction along a surface of the first conductive layer.

The first electrode layer includes an electrode area that is provided on at least the second area such that a width thereof in the direction along the surface of the first conductive layer becomes smaller than the width of the second area.

A semiconductor light-emitting device according to another embodiment of the present technology is a semiconductor light-emitting device including a light-emitting edge and an opposite edge, and includes a first conductive layer, a second conductive layer, an active layer, a first electrode layer, and a second electrode layer.

Particularly, an optical waveguide of the active layer includes a spread area provided such that a width of the optical waveguide in a direction along a surface of the active layer widens from a predetermined position toward the light-emitting edge in the one direction.

The first electrode layer includes an electrode area that is provided on at least the spread area such that a width thereof in the direction along the surface of the active layer becomes smaller than the width of the spread area.

A semiconductor light-emitting device according to another embodiment of the present technology is a semiconductor light-emitting device including a light-emitting edge and an opposite edge, and includes a first conductive layer, a second conductive layer, an active layer, a first electrode layer, and a second electrode layer.

Particularly, an optical waveguide of the active layer includes a first area and a second area. The first area is provided from a first position to a second position in the one direction. The second area is provided from the second position to the light-emitting edge and includes a width larger than a width of the first area in a direction along a surface of the first conductive layer.

The first electrode layer includes an electrode area that is provided on at least the second area such that a width thereof in the direction along the surface of the first conductive layer becomes smaller than the width of the second area.

A display apparatus according to an embodiment of the present technology includes the semiconductor light-emitting device described above and an image generation unit. The image generation unit is capable of 2-dimensionally scanning light emitted from the semiconductor light-emitting device and controlling luminance obtained by the light projected, on the basis of image data.

Advantageous Effects of Invention

As described above, according to the present technology, an output can be raised while maintaining a wide emission spectrum width.

It should be noted that the effects described herein are not necessarily limited, and any effect described in the present disclosure may be obtained.

BRIEF DESCRIPTION OF DRAWINGS

FIGS. 1A and 1B FIG. 1A is a schematic perspective view of a semiconductor light-emitting device according to a first embodiment of the present technology.

FIGS. 5A and 5B FIG. 5A is a graph obtained by a simulation, that shows a relationship between an injection current and a light output in the case of the current narrowing structure according to this embodiment, that includes a spread angle, and a case of a configuration not including that.

MODES FOR CARRYING OUT THE INVENTION

Hereinafter, embodiments of the present technology will be described with reference to the drawings. In descriptions below, terms "up", "down", "right", "left", and the like that indicate directions are merely used to help understand the descriptions and do not limit apparatuses and devices according to the embodiments.

1. First Embodiment

1) Overall Structure of Semiconductor Light-Emitting Device

Figure 1A:
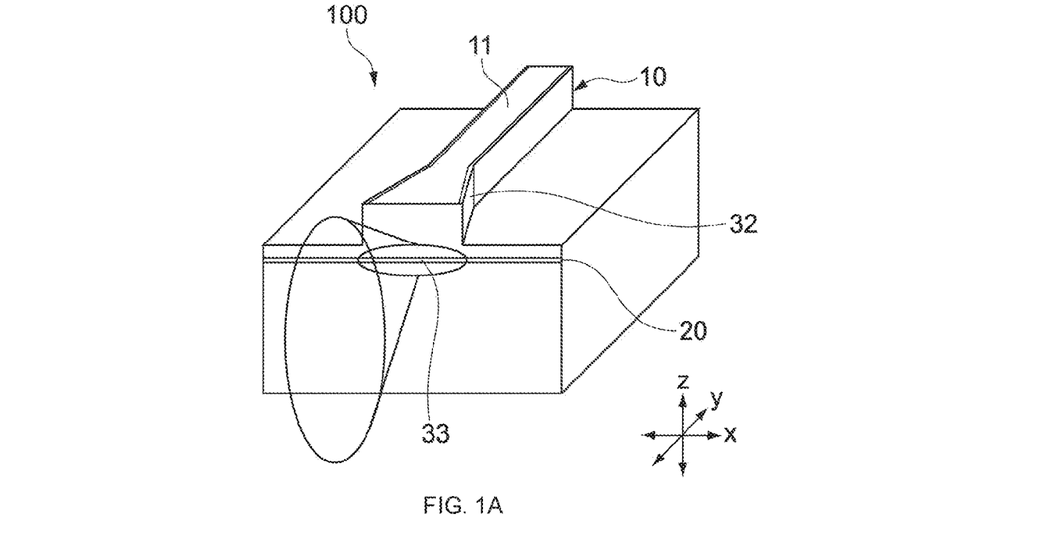
Figure 1B:
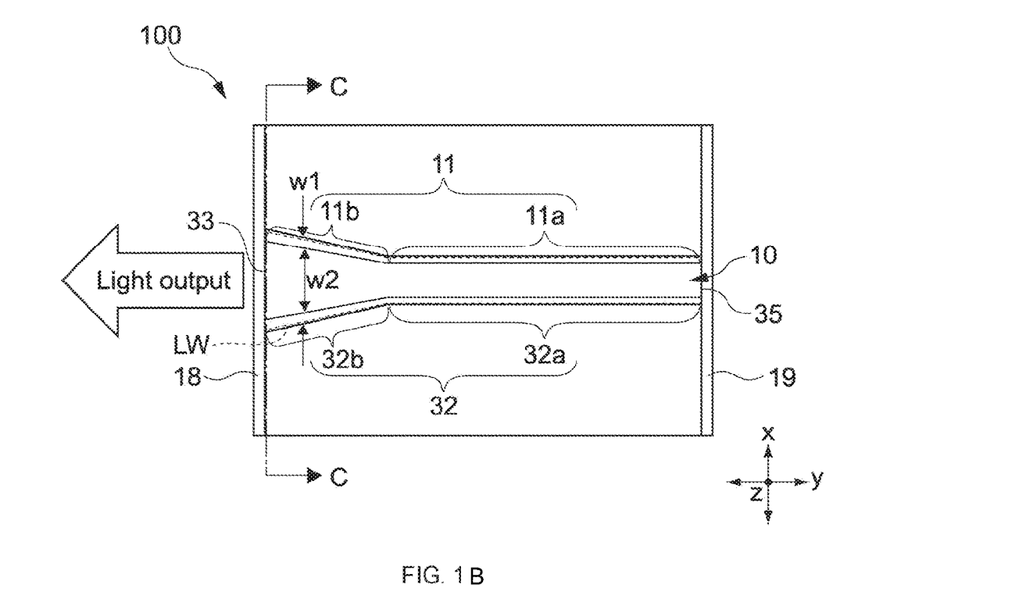
FIG. 1B is a plan view thereof.
Figure 2:
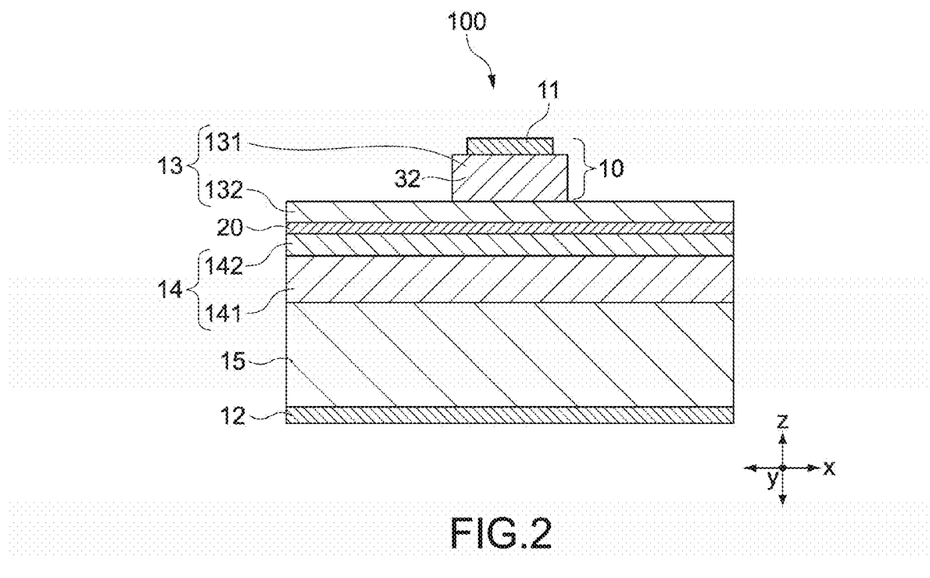
FIG. 2 is a cross-sectional diagram taken along C-C of FIG. 1B.

FIG. 1A is a schematic perspective view of a semiconductor light-emitting device according to a first embodiment of the present technology, and FIG. 1B is a plan view thereof. FIG. 2 is a cross-sectional diagram taken along C-C of FIG. 1B. This semiconductor light-emitting device is a ridge-type super luminescent diode (SLD) that includes a ridge portion 10 in a p-type or n-type conductive layer, for example.

An SLD 100 includes, from the top of FIG. 2, a first electrode layer (or contact layer that is in contact with first electrode (not shown)) 11, a first conductive layer 13 of a p-type out of semiconductor layers, an active layer 20, a second conductive layer 14 of an n-type out of the semiconductor layers, an n-type semiconductor substrate 15, and a second electrode layer (or contact layer that is in contact with second electrode (not shown)) 12. Although the second electrode layer 12 is provided so as to be in contact with (e.g., back surface of) the substrate 15, it may be provided so as to be in contact with the second conductive layer 14.

The first conductive layer 13 includes a p-type clad layer 131 and a p-type guide layer 132 that are sequentially formed from the first electrode layer 11 side. The second conductive layer 14 includes an n-type clad layer 141 and an n-type guide layer 142 that are sequentially formed from the substrate 15 side. For example, the first electrode layer 11 and the p-type clad layer 131 configure the ridge portion 10. An n-type buffer layer may be provided between the substrate 15 and the second conductive layer 14.

As shown in FIG. 1B, the semiconductor light-emitting device includes a light-emitting edge 33 and an opposite edge 35 opposite thereto. The ridge portion 10 is configured such that a longitudinal direction thereof is provided along one direction from the opposite edge 35 to the light-emitting edge 33, that is, a y direction. Typically, the ridge portion 10 is provided across from the opposite edge 35 to the light-emitting edge.

As shown in FIG. 1A, the first conductive layer 13 of the ridge portion 10 includes a current narrowing structure 32. Specifically, the current narrowing structure 32 structured such that a current injection area from the first electrode layer 11 to the active layer 20 is narrowed is formed by the structure of the ridge portion 10. In this embodiment, the first conductive layer 13 (p-type clad layer 131) provided in the ridge portion 10 substantially becomes the current narrowing structure 32. At least in the active layer 20, an optical waveguide is formed along the longitudinal direction of the ridge portion 10 in the vicinity of the ridge portion 10 (right below ridge portion 10 and periphery thereof).

On the p-type guide layer 132 and in the periphery of the ridge portion 10, an insulation layer (not shown) is formed.

It should be noted that although a lower edge of the p-type clad layer 131 coincides with a lower edge of the ridge portion 10, it may be otherwise, or the lower edge of the ridge portion 10 may include a part of the p-type guide layer 132.

As shown in FIG. 1B, a low-reflection mirror film 18 is provided at the light-emitting edge 33 of the SLD 100, and a high-reflection mirror film 19 is provided at the opposite edge 35 as an edge on the opposite side. Of light spontaneously emitted from the active layer 20, light that travels toward the high-reflection mirror film 19 side is reflected by the high-reflection mirror film 19, amplified while traveling toward the light-emitting surface side, and emitted via the low-reflection mirror film 18.

2) Structure of Ridge Portion of Semiconductor Light-Emitting Device

As shown in FIG. 1B, the first conductive layer 13 of the ridge portion 10 of this embodiment, that is, the current narrowing structure 32 includes a linear area 32a and a spread area 32b along one direction (y direction) in which the ridge portion 10 extends.

The linear area 32a is an area that is provided across from the opposite edge 35 to a predetermined position and includes a constant width. The "width" is a width in a direction along a surface of the first conductive layer 13 (i.e., x-y plane parallel to each layer), which is a width in an x direction intersecting the y direction herein. The spread area 32b is provided such that a width thereof in the x direction widens from the predetermined position toward the light-emitting edge 33 and extends to the light-emitting edge 33. In other words, in the spread area 32b, side surfaces of the first conductive layer 13 are tapered as shown in FIG. 1A.

In descriptions below, when simply referred to as "width" for the current narrowing structure 32 of the first conductive layer 13 and the first electrode layer 11, it refers to the width in the x direction.

Figure 3:
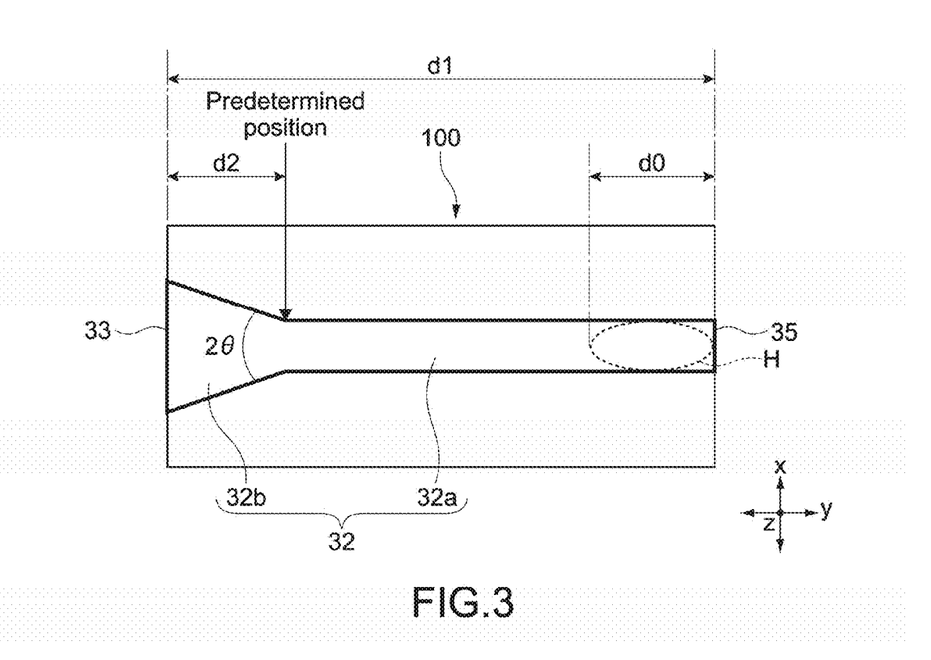
FIG. 3 A schematic diagram for explaining a positional relationship between a linear area and spread area of a current narrowing structure.

FIG. 3 is a schematic diagram for explaining the predetermined position, and the diagram shows the SLD 100 from a z direction while emphasizing an outer shape of the current narrowing structure.

The "predetermined position" as a start point of the spread area 32b is set as follows, for example. In a partial area of the linear area 32a on the opposite edge 35 side, only spontaneous emission of light is carried out, and no stimulated emission is carried out. A length of this spontaneous emission area H in the y direction is represented as spontaneous emission area length d0. Further, a total length of the current narrowing structure 32 in the y direction is represented by d1, and a length of the spread area 32b in the y direction is represented by d2. As a result, d2 can be expressed by the following expression, and the "predetermined position" is set.

$$(d1-d0)*0.1 \leq d2 \leq (d1-d0)*0.3$$

In general, the spontaneous emission area length d0 is about 300 μm to 1000 μm, typically about 500 μm. In such an SLD, d0 is generally set to be constant irrespective of the total length d1.

Setting the length to such a spread area length d2 contributes to a satisfaction of both an achievement of a wide spectrum width and a high output.

Seen from the z direction, an entire spread angle α (see FIG. 4) of the spread area 32b is set to be 1° to 8°, for example, more favorably, 2° to 6°.

As shown in FIG. 1B, the first electrode layer 11 has a shape similar to that of the first conductive layer 13 including the current narrowing structure 32. Specifically, the first electrode layer 11 includes a linear electrode area 11a provided with a constant width and a spread electrode area 11b provided such that a width widens toward the light-emitting edge 33. The linear electrode area 11a and the spread electrode area 11b are respectively arranged on the linear area 32a and spread area 32b of the current narrowing structure 32. The spread electrode area 11b extends from a left edge of the linear electrode area 11a in the figure to the light-emitting edge 33.

Particularly in this embodiment, at least a width w2 of the spread electrode area 11b is smaller than a width w1 of the spread area 32b at the same position in the y direction. Further, a width of the linear electrode area 11a is also smaller than that of the linear area 32a.

3) Configuration of Spread Area of Current Narrowing Structure for Realizing Desired Light Distribution A width (width in x direction) of a light intensity distribution of an optical waveguide LW formed in the active layer 20 by the structure of the ridge portion 10 can be assumed as $1/e^2$ the peak intensity of light.

Assuming that the entire spread angle of the spread area 32b of the current narrowing structure 32 is represented by α as described above, the optical waveguide LW below that spread area 32b also has a spread angle equivalent to that angle. In other words, as described above, the entire spread angle of the optical waveguide LW below the spread area 32b is also set to be 1° to 8°, for example, more favorably, 2° to 6°.

Figure 4:
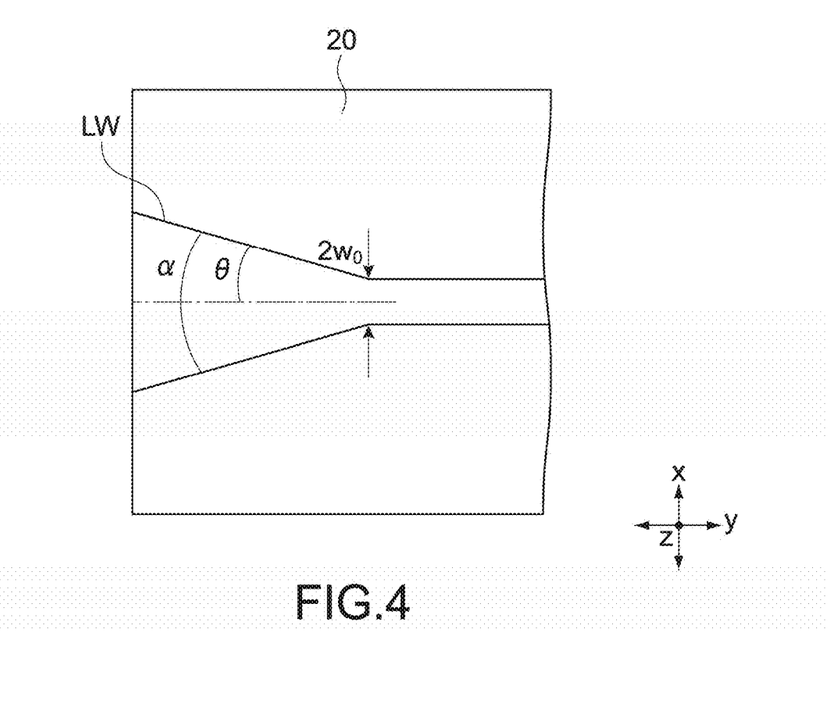
FIG. 4 A schematic diagram for explaining a spread of a carrier injected from a first electrode layer.

Alternatively, the spread area 32b may be designed such that the spread angle θ of the optical waveguide LW (½ the entire spread angle α described above) below the spread area 32b of the current narrowing structure 32 satisfies the following expression as shown in FIG. 4.

$$\theta = \arctan[\lambda/(\pi w_0 n)]$$

λ: Optical wavelength
$w_0$: ½ the width (minimum width) of start point of spread area 32b
n: Refractive index of active layer 20

Light that progresses through the optical waveguide below the spread area 32b is light that progresses so as to exit the optical waveguide below the linear area 32a having a small width to go out to a wide area. In a case where there is no element such as a wall that restricts light that progresses the spread area 32b on both sides in the x direction, that light progresses the spread area 32b as diffracted light defined by θ above (=α/2). Since light having a spread angle exceeding that diffraction angle θ is not generated, there is no need to form the spread area 32b of the current narrowing structure 32 that largely exceeds that diffraction angle θ.

Figure 5A:
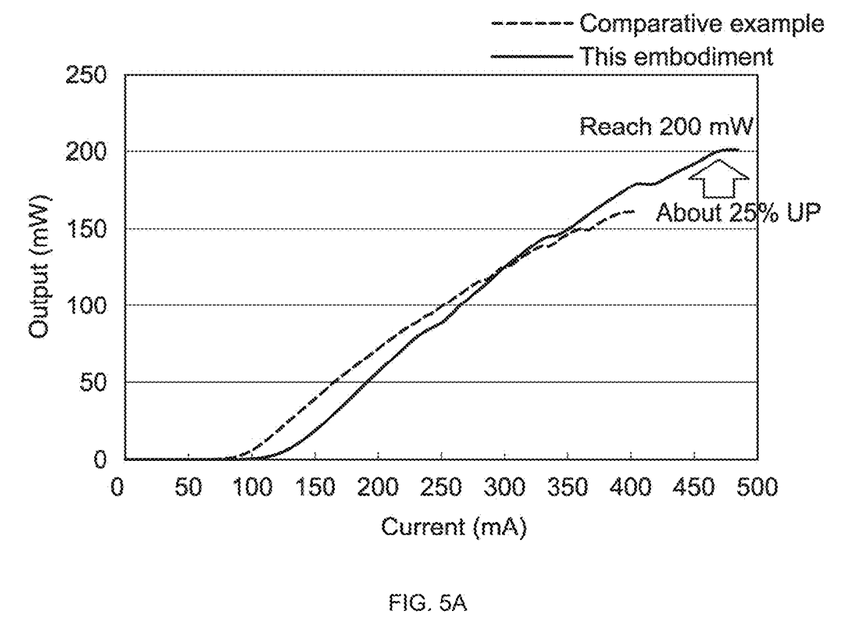

FIG. 5A is a graph obtained by a simulation, that shows a relationship between an injection current and a light output in the case of the current narrowing structure 32 according to this embodiment, that includes a spread angle, and a case of a configuration not including that. A result of the current narrowing structure 32 of this embodiment is indicated by a solid line, and a result of a comparative example not including a spread angle is indicated by a broken line. In the simulation, for example, the spread angle α of the current narrowing structure 32 is set to 3°, and the optical waveguide length is set to 2000 μm. The configuration not including a spread angle means spread angle=0°, which is a configuration in which a linear area extends from the opposite edge to the light-emitting edge.

As can be seen from this graph, this embodiment including a spread angle can realize a high output with an injection current of about 300 mA or more. An output increase of about 25% was obtained as the highest output.

4) Configuration of Spread Electrode Area of First Electrode Layer for Realizing Desired Light Distribution Further, this SLD 100 is characterized in that, as shown in FIG. 1B, at least the width w2 of the spread electrode area 11b of the first electrode layer 11 is designed to be smaller than the width w1 of the spread area 32b of the current narrowing structure 32.

Figure 5B:
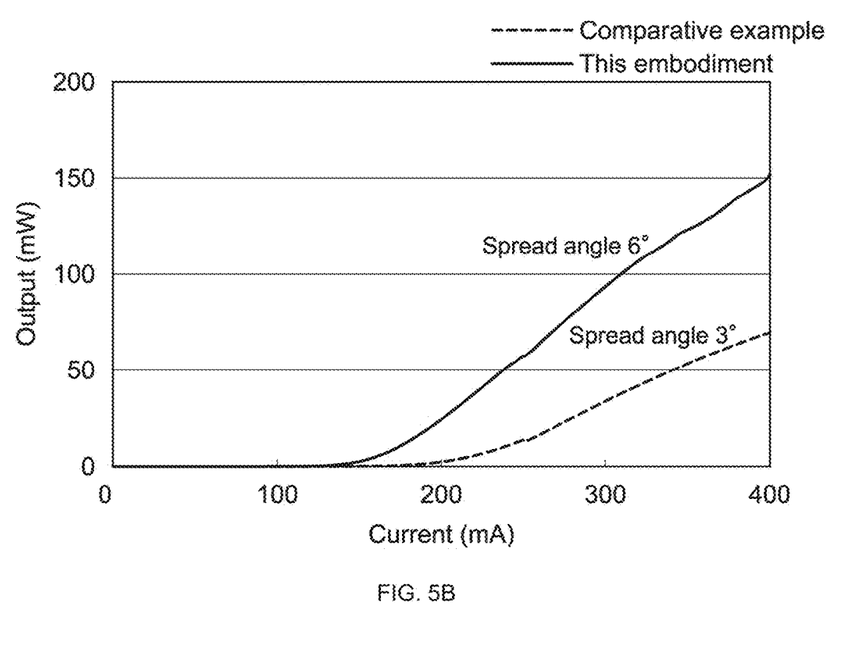
FIG. 5B is a graph obtained by a simulation, that shows a difference in the light output caused by a difference between a spread angle of the spread area and that of the electrode area.

FIG. 5B is a graph obtained by a simulation, that shows a difference in the light output caused by a difference between the spread angle α (e.g., α=2θ) of the spread area 32b and a spread angle β of the electrode area 11b. In this simulation, the entire spread angle α of the current narrowing structure 32 was fixed to 4°, the waveguide length was set to 2000 μm, and d2 above was set to 500 μm, for example. In the graph, configurations including the spread angle β of the spread electrode area 11b of 3° (comparative example) and 6° (this embodiment) are shown.

As can be seen from the graph, with an injection current exceeding 100 mA, a higher output was realized in the case of α>β (α=4°, β=3°) than in the case of α<β (α=4°, β=6°).

Figure 6:
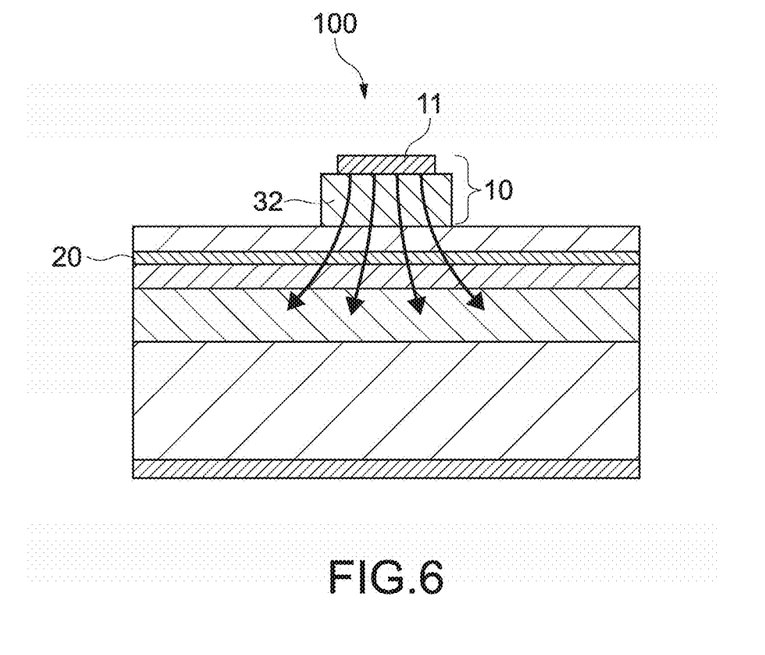
FIG. 6 is a diagram showing a flow of a current (carrier) flowing from the first electrode layer toward an active layer using arrows.

FIG. 6 is a diagram showing a flow of a current (carrier) flowing from the first electrode layer 11 toward the active layer 20 using arrows. In this way, the carrier flows so as to spread 3-dimensionally from the first electrode layer 11 toward the active layer 20. Therefore, by forming the width of at least the spread electrode area 11b of the first electrode layer 11 to become smaller than that of the spread area 32b below that, it is possible to obtain an efficient interaction between the current and light, that takes such a spread of the carrier into account. In other words, according to the structure of the ridge portion 10 as described above, an efficient current state for realizing a wide emission spectrum width and a high output can be generated by an electrode of a minimum size.

5) Comparison of Intensity Distribution of Spontaneous Emission Light

Figure 7A:
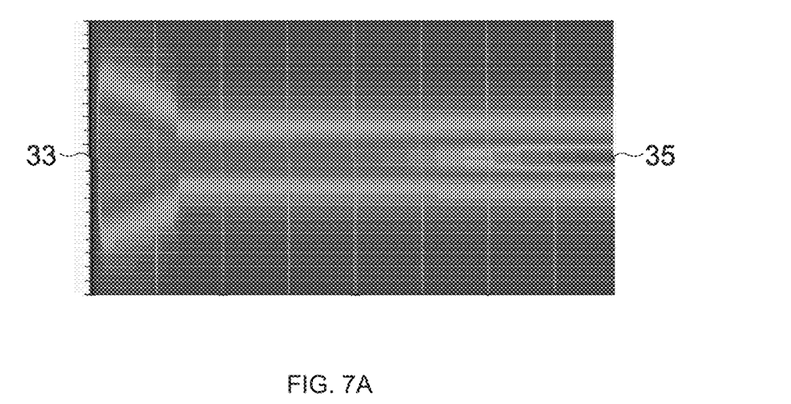
FIGS. 7A and 7B each show a simulation of an intensity distribution of spontaneous emission light in an optical waveguide of an SLD including a ridge portion according to this embodiment.
Figure 7B:
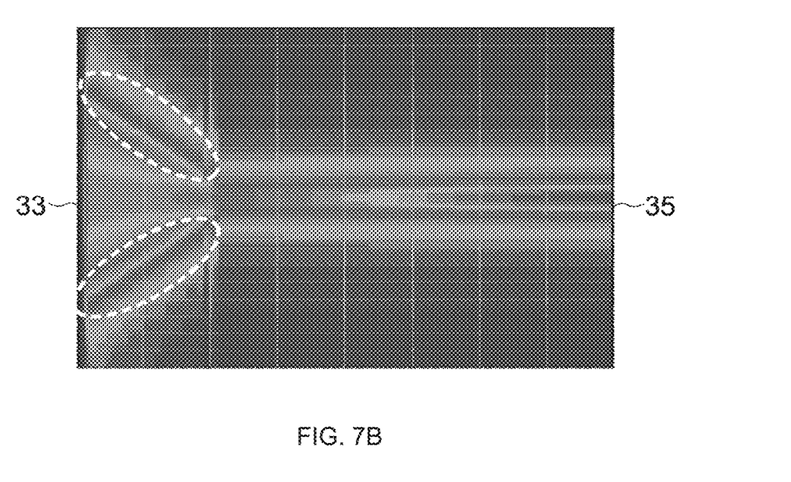

FIG. 7A shows a simulation of an intensity distribution of spontaneous emission light in the optical waveguide LW of the SLD 100 including the ridge portion 10 according to this embodiment. FIG. 7B similarly shows a simulation of the intensity distribution of spontaneous emission light, and shows a light intensity distribution in a case where the spread angles of the spread area 32b and spread electrode area 11b of the current narrowing structure 32 and first electrode layer 11, respectively, are too large. It should be noted that there is a need to be careful that these light intensity distributions express light intensity distributions of only spontaneous emission light and are not light intensity distributions after light amplification.

In FIG. 7B, since the spread electrode width is too large, useless spontaneous emission light (not amplified light) is generated in a width larger than that of the optical waveguide as a waveguide of amplified light. In FIG. 7B, areas where useless spontaneous emission light is generated are illustrated in dark gray within white broken lines. In contrast, in FIG. 7A, since the width of the spread electrode area 11b is smaller than that of the optical waveguide (i.e., spread area 32b), efficient light emission can be realized as described above. This supports the consideration described with reference to FIG. 6.

It should be noted that the applicant is also capable of submitting FIGS. 7A and 7B in color when requested by your office or department.

6) Conclusion

As described above, in the SLD 100 of this embodiment, the current narrowing structure 32 of the first conductive layer 13 includes the spread area 32*b*. With such a structure of the ridge portion 10, a high output can be realized while maintaining a wide emission spectrum width of the past.

Further, since the width of at least the spread electrode area 11*b* of the first electrode layer 11 is smaller than that of the spread area 32*b*, efficiency of an interaction between the current and light can be enhanced, thus contributing to a high output.

In this embodiment, by the highly-efficient use of the carrier (not using useless carrier), unnecessary heat generation can be suppressed, which bears a large effect in an improvement of output temperature characteristics. This becomes a large advantage particularly in the case of materials capable of emitting red light (ALGaInP base) since temperature characteristics thereof are apt to become a problem.

Also since the spread electrode area 11*b* including an area wider than that of the past is provided in this embodiment, an optical energy density can be lowered on the light-emitting edge 33 side. In other words, even in a case where the injection current is increased for realizing a high output, an increase of the current density can be suppressed. As a result, a situation where the light-emitting edge 33 becomes high in temperature can be avoided. Therefore, occurrence of a failure, malfunction, and the like is suppressed, and product reliability is enhanced.

The shape of the spread area 32*b*, the width of the first electrode layer 11, and the like are easily determined from an outer appearance. Therefore, it is possible to determine whether the present technology is used in a product by a simulation, pattern measurement (NFP, FFP measurement) of output light in the light-emitting edge 33, and the like.

In a production process of the SLD 100 of this embodiment, an addition of a special process technology, a change of conditions, and the like are unnecessary. Moreover, since there is no restriction on the semiconductor material, the present technology is also applicable to SLDs that emit light of other wavelengths.

As the semiconductor light-emitting device, the present technology is applicable to not only the SLD but also an optical amplifier including an operation mechanism similar to that of the SLD, and effects similar to those described above can be expected.

7) Regarding Difficulty in Realizing Both of Wide Spectrum Width and High Output For obtaining a high output, means of a) injecting a large amount of current into an SLD, b) setting an optical waveguide length long, c) increasing a ridge width, and the like are conceivable. However, any of these means causes problems as follows.

a) In the case of injecting a large amount of current, an upper limit thereof is restricted by thermal saturation of an output, so, for the high output, a heat radiation load on an SLD package becomes large, thus causing an increase in costs. Also in the case of injecting a large amount of current, the SLD is put to a state where it is apt to cause laser oscillation even with a small edge surface reflection. Therefore, there is a need to operate the SLD with a current far lower than the current at a time of the thermal saturation.

b) In the case of setting the optical waveguide length long, light is amplified in a longer path before being taken out, so there are the following defects although the light intensity becomes high.

One is that since amplification of light due to stimulated emission is facilitated, this influences an emission spectrum shape. Specifically, the emission spectrum width becomes smaller as the optical waveguide length, that is, the length of the path where light can be amplified, becomes longer. Therefore, the precious low coherency is lowered (apt to be interfered). In other words, the low coherency and the output are in a trade-off relationship.

The other is that the SLD becomes large and is inadequate for package miniaturization and that the entire waveguide loss increases so that light conversion efficiency is apt to become poor.

c) In the case of increasing the ridge width, it is possible to lower a concentrated current density and increase an area to emit light to raise the output. However, since a width of a beam to be output is increased that much, the light source becomes difficult to be used in terms of application, so an upper limit is also set for the ridge width. There is also a problem that by additionally widening the ridge width, guidable modes increase. However, it can be said that the present technology has solved these problems by appropriately arranging the spread area 32*b* and setting a width thereof.

d) As another method for obtaining light of a high output, a method of increasing a spectrum width at a stage of spontaneous emission light before light is amplified is conceivable. However, for realizing this, design changes such as a separation of an injection electrode of a corresponding emission area, a change to a different active layer material or active layer structure only for that area, and the like are necessary. In the former case, since electrodes need to be divided and driven by different drivers, an uneconomic structure is obtained. In the latter case, it becomes extremely difficult to produce the structure since regrowth of crystals becomes necessary and the like, thus leading to high costs after all. Since currents to be consumed are basically apt to increase by these two methods in the first place, efficiency as a light source is increasingly lowered.

The present technology can overcome these problems described above and realize a high output while maintaining a wide spectrum width.

2. Second Embodiment

Figure 8:
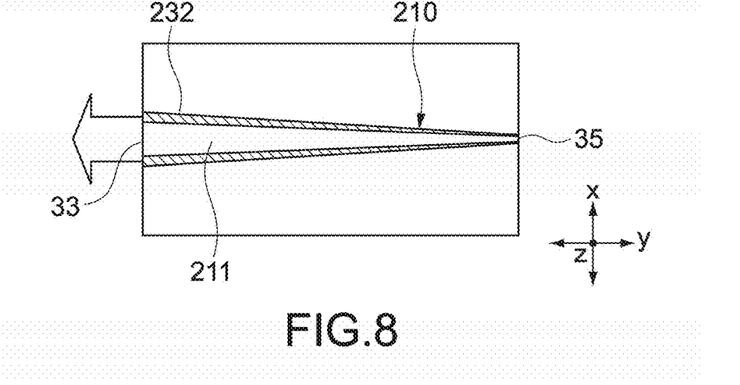
FIG. 8 is a plan view of an SLD according to a second embodiment of the present technology.

FIG. 8 is a plan view of an SLD according to a second embodiment of the present technology. In descriptions below, descriptions on members, functions, and the like similar to those of the SLD 100 according to the first embodiment will be simplified or omitted, and different points will mainly be described.

A hatched current narrowing structure 232 of a ridge portion 210 of the SLD according to this embodiment does not include the linear area 32*a* as in the first embodiment. The current narrowing structure 232 is provided so as to widen toward the light-emitting edge 33 across the entire area from the opposite edge 35 to the light-emitting edge 33 of the SLD. In other words, the entire current narrowing structure 232 is configured by a spread area.

A first electrode layer 211 is configured by a spread electrode area including a width smaller than that of the current narrowing structure 232 across the entire area from the opposite edge 35 to the light-emitting edge 33.

A spread angle of the current narrowing structure 232 and that of the first electrode layer 211 are set to spread angles similar to those of the first embodiment.

With such a structure of the ridge portion 210, an optical waveguide (light distribution) (not shown) having a width and shape equivalent to those of the current narrowing structure 232 is formed.

3. Third Embodiment

Figure 9:
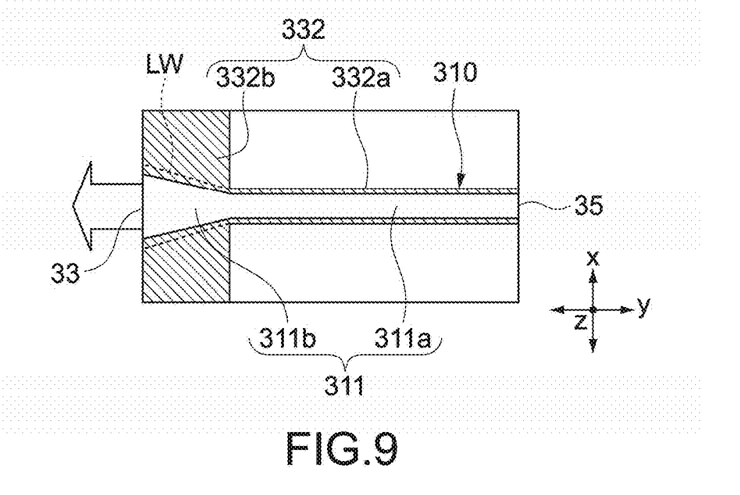
FIG. 9 is a plan view of an SLD according to a third embodiment of the present technology.

FIG. 9 is a plan view of an SLD according to a third embodiment of the present technology. A hatched current narrowing structure 332 of this SLD includes a linear area (first area) 332a and a wide rectangular area (second area) 332b. The wide rectangular area 332b is an area having an entire spread angle of 180° from the linear area 332a.

A width of the rectangular area 332b is larger than that of the linear area 332a. For example, that width substantially matches the width of the SLD in the x direction. Widths of a linear electrode area 311a and spread electrode area 311b of a first electrode layer 311 are formed to be smaller than the widths of the linear area 332a and rectangular area 332b of the current narrowing structure 332, respectively.

By a ridge portion 310 including such a structure, an optical waveguide (light distribution) LW indicated by broken lines that widen from the linear area 332a toward the light-emitting edge 33 is formed in accordance with the shape of the spread electrode area 311b.

It has been described above that there is no need to form the spread area 32b whose spread angle of light distribution from the linear area 32a largely exceeds the light diffraction angle θ. However, the wide rectangular area 332b as in this embodiment may be formed in a case where there are other advantageous reasons.

4. Fourth Embodiment

Figure 10:
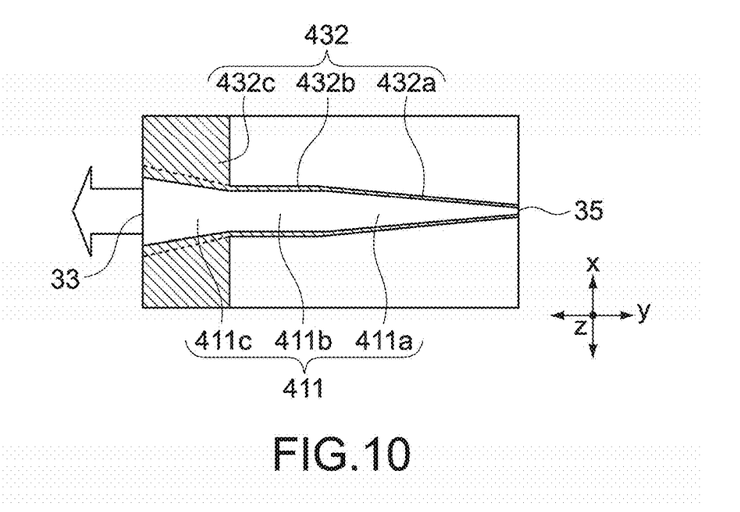
FIG. 10 is a plan view of an SLD according to a fourth embodiment of the present technology.

FIG. 10 is a plan view of an SLD according to a fourth embodiment of the present technology. A hatched current narrowing structure 432 of this SLD includes a spread area 432a, a linear area 432b, and a wide rectangular area 432c. While this spread area 432a is an area that widens toward the light-emitting edge 33, it is a spread area provided on the opposite edge 35 side. A first electrode layer 411 includes a first spread electrode area 411a, a linear electrode area 411b, and a second spread electrode area 411c.

Also in this embodiment, an optical waveguide (light distribution) LW indicated by broken lines is formed below the second spread electrode area 411c in accordance with the shape of the second spread electrode area 411c, similar to the third embodiment.

5. Fifth Embodiment

Figure 11:
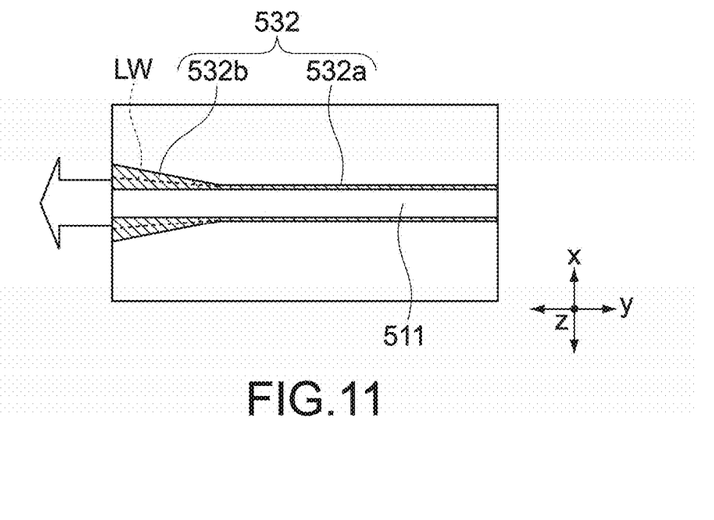
FIG. 11 is a plan view of an SLD according to a fifth embodiment of the present technology.

FIG. 11 is a plan view of an SLD according to a fifth embodiment of the present technology. A hatched current narrowing structure 532 of this SLD includes a linear area 532a and a spread area 532b as in the first embodiment. On the other hand, a first electrode layer 511 includes a constant width across from the opposite edge 35 to the light-emitting edge 33, for example. This width is a width of an electrode area provided above the linear area 532a.

In this way, the first electrode layer 511 does not necessarily need to include a spread electrode like those of the respective embodiments above, that widens toward the light-emitting edge 33. The broken lines indicate an optical waveguide (light distribution) LW formed below the spread electrode area.

6. Display Apparatus

Figure 12:
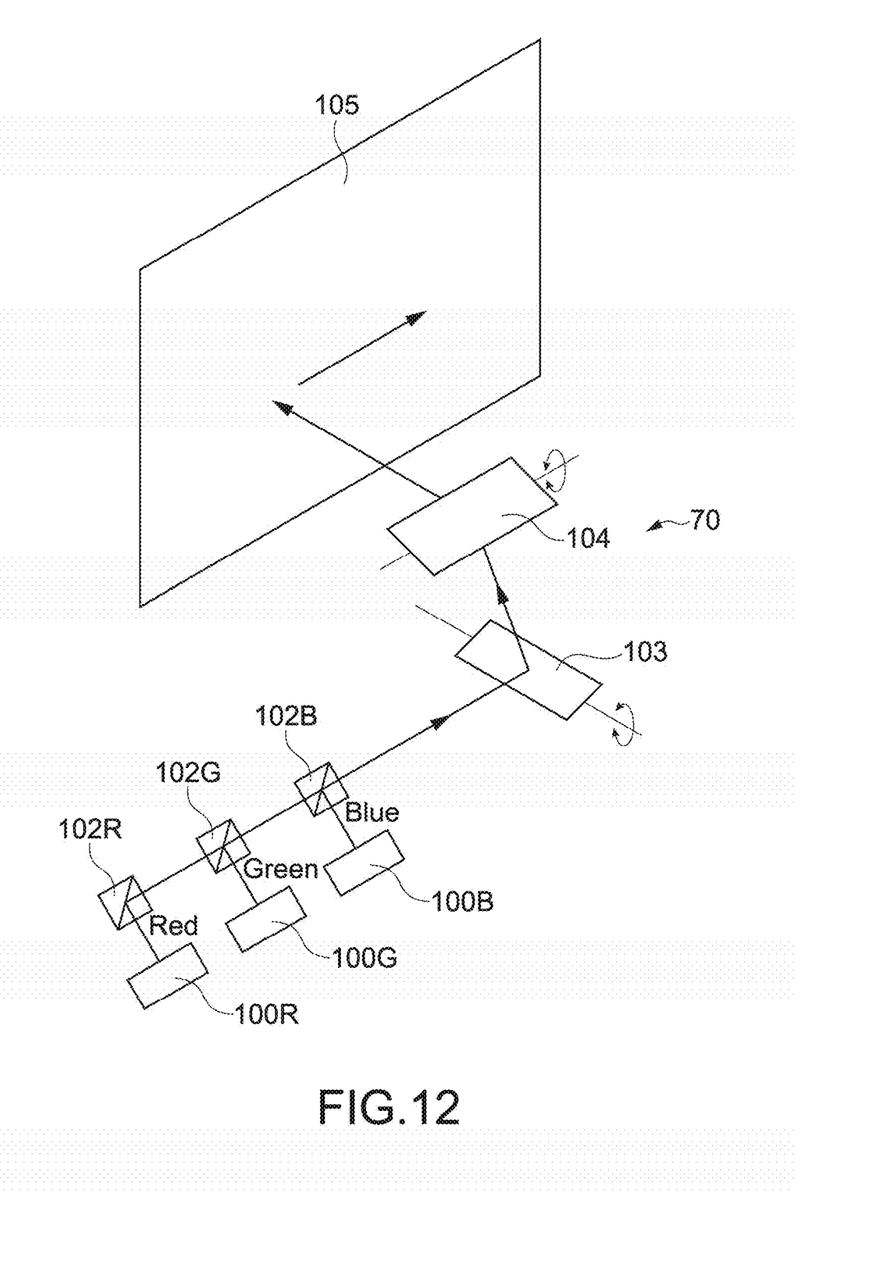
FIG. 12 schematically shows a configuration of a display apparatus that uses, as a light source, the semiconductor light-emitting device according to one of the embodiments described above.

FIG. 12 schematically shows a configuration of a display apparatus that uses, as a light source, any of the SLDs as the semiconductor light-emitting devices according to the respective embodiments. This display apparatus 200 is a raster-scan-type projector.

The display apparatus 200 includes an image generation unit 70. The image generation unit 70 is capable of 2-dimensionally scanning, for example, raster-scanning light emitted from the semiconductor light-emitting device as the light source and is configured to be capable of controlling luminance obtained by light projected onto an irradiation surface 105 such as a screen and a wall surface on the basis of image data.

The image generation unit 70 mainly includes, for example, a horizontal scanner 103 and a vertical scanner 104. Beams from a red light emission SLD 100R, a green light emission SLD 100G, and a blue light emission SLD 100B are integrated as one beam by dichroic prisms 102R, 102G, and 102B. By this beam being scanned by the horizontal scanner 103 and the vertical scanner 104 and projected onto the irradiation surface 105, an image is displayed.

It should be noted that at least one of the semiconductor light-emitting devices that emit light of the respective colors of RGB needs to be an SLD, and the other devices may be normal LDs.

The horizontal scanner 103 and the vertical scanner 104 are configured by a combination of a polygon mirror and a galvanic scanner, for example. In this case, a circuit that controls a current to be injected into a semiconductor light-emitting device, for example, is used as means for controlling luminance.

Alternatively, a 2-dimensional light modulation device such as a DMD (Digital Micro-mirror Device) that is produced using a MEMS (Micro Electro Mechanical System) technology, for example, may be used as the horizontal scanner and the vertical scanner.

Alternatively, the image generation unit 70 may be configured by a combination of a 1-dimensional light modulation device such as a GLV (Grating Light Valve) device and the 1-dimensional scan mirror described above.

Alternatively, the image generation unit 70 may be configured by a refractive index modulation-type scanner such as an acousto-optical effect scanner and an electro-optical effect scanner.

7. Various Other Embodiments

The present technology is not limited to the embodiments described above, and various other embodiments can also be realized.

Although the width of the linear electrode area of the first electrode layer is smaller than that of the current narrowing structure below that in the embodiments above, the width may be the same as or larger than that of the current narrowing structure. Since an insulation layer may be formed on both side portions of the ridge portion, a linear electrode area having a wider width than the current narrowing structure can be formed.

The spread areas and spread electrode areas of the embodiments above are not limited to the tapered shape. For example, they may be formed so as to widen stepwise or in a curve. In this case, an angle formed between sides forming the steps is not limited to a right angle and may be a sharp angle or an obtuse angle.

The SLDs as the semiconductor light-emitting devices of the embodiments above include the light-emitting edge 33 and the opposite edge 35 on the opposite side. However, both edges of the SLD may be the light-emitting edge. In other words, in this case, an opposite edge of one of the light-emitting edges becomes the other light-emitting edge. In this case, a spontaneous emission area is provided at substantially the center position of the ridge portion of the SLD in (one direction which is) the longitudinal direction, for example. A spread area formed such that a width thereof widens toward the light-emitting edges on both sides from that center position or predetermined positions (two positions) each located a predetermined distance from that center position is provided in the current narrowing structure.

Although the n-type substrate is used as the substrate in the embodiments above, a p-type substrate may be used instead, and a semiconductor layer configuring the current narrowing structure may be of an n-type. In this case, a "first conductivity type" becomes the n type, and a "second conductivity type" becomes the p type.

At least two of the feature portions of the embodiments described above can be combined.

It should be noted that the present technology can also take the following configurations.

(1) A semiconductor light-emitting device including a light-emitting edge and an opposite edge opposite thereto, including:

a first conductive layer that includes a current narrowing structure configured such that a current injection area is narrowed and is configured such that a longitudinal direction of the current narrowing structure is provided along one direction from the opposite edge to the light-emitting edge;

a second conductive layer;

an active layer provided between the first conductive layer and the second conductive layer; and a first electrode layer and a second electrode layer that are respectively provided in contact with the first conductive layer and the second conductive layer, the current narrowing structure including a spread area provided such that a width of the current narrowing structure in a direction along a surface of the first conductive layer widens from a predetermined position toward the light-emitting edge in the one direction, and the first electrode layer including an electrode area that is provided on at least the spread area such that a width thereof in the direction along the surface of the first conductive layer becomes smaller than the width of the spread area.

(2) The semiconductor light-emitting device according to (1), in which the electrode area of the first electrode layer is a spread electrode area provided such that the width widens toward the light-emitting edge in the one direction.

(3) The semiconductor light-emitting device according to (1) or (2), in which an edge of the electrode area on the light-emitting edge side in the one direction extends to the light-emitting edge.

(4) The semiconductor light-emitting device according to any one of (1) to (3), in which the current narrowing structure includes an area that is provided from the opposite edge to the predetermined position and includes a constant width smaller than the width of the spread area.

(5) The semiconductor light-emitting device according to any one of (1) to (3), in which the spread area extends from the opposite edge to the light-emitting edge.

(6) The semiconductor light-emitting device according to any one of (1) to (5), in which when a spread angle of an optical waveguide below the spread area, that is formed in the active layer by the current narrowing structure, is represented by $\theta$, an optical wavelength is represented by $\lambda$, ½ a minimum width of the spread area in the direction along the surface is represented by $w_0$, and a refractive index of the active layer is represented by n, $$\theta = \arctan(\lambda/(\pi w_0 n))$$

is satisfied.

(7) The semiconductor light-emitting device according to any one of (1) to (6), in which the electrode area of the first electrode layer includes a width smaller than a width that is $1/e^2$ a peak intensity of light that passes an optical waveguide formed in the active layer by the current narrowing structure.

(8) A semiconductor light-emitting device including a light-emitting edge and an opposite edge opposite thereto, including:

a first conductive layer that includes a current narrowing structure configured such that a current injection area is narrowed and is configured such that a longitudinal direction of the current narrowing structure is provided along one direction from the opposite edge to the light-emitting edge;

a second conductive layer;

an active layer provided between the first conductive layer and the second conductive layer; and a first electrode layer and a second electrode layer that are respectively provided in contact with the first conductive layer and the second conductive layer, the current narrowing structure including a first area provided from a first position to a second position in the one direction, and a second area that is provided from the second position to the light-emitting edge and includes a width larger than a width of the first area in a direction along a surface of the first conductive layer, and the first electrode layer including an electrode area that is provided on at least the second area such that a width thereof in the direction along the surface of the first conductive layer becomes smaller than the width of the second area.

(9) A semiconductor light-emitting device including a light-emitting edge and an opposite edge opposite thereto, including:

a first conductive layer and a second conductive layer;

an active layer that includes an optical waveguide whose longitudinal direction is provided along one direction from the opposite edge to the light-emitting edge and is provided between the first conductive layer and the second conductive layer; and a first electrode layer and a second electrode layer that are respectively provided on the first conductive layer and the second conductive layer, the optical waveguide of the active layer including a spread area provided such that a width of the optical waveguide in a direction along a surface of the active layer widens from a predetermined position toward the light-emitting edge in the one direction, and the first electrode layer including an electrode area that is provided on at least the spread area such that a width thereof in the direction along the surface of the active layer becomes smaller than the width of the spread area.

(10) A semiconductor light-emitting device including a light-emitting edge and an opposite edge opposite thereto, including:

a first conductive layer and a second conductive layer;

an active layer that includes an optical waveguide whose longitudinal direction is provided along one direction from the opposite edge to the light-emitting edge and is provided between the first conductive layer and the second conductive layer; and a first electrode layer and a second electrode layer that are respectively provided on the first conductive layer and the second conductive layer, the optical waveguide of the active layer including a first area provided from a first position to a second position in the one direction, and a second area that is provided from the second position to the light-emitting edge and includes a width larger than a width of the first area in a direction along a surface of the first conductive layer, and the first electrode layer including an electrode area that is provided on at least the second area such that a width thereof in the direction along the surface of the first conductive layer becomes smaller than the width of the second area.

(11) A display apparatus, including:

a semiconductor light-emitting device including a light-emitting edge and an opposite edge opposite thereto; and an image generation unit that is capable of 2-dimensionally scanning light emitted from the semiconductor light-emitting device and controlling luminance obtained by the light projected, on the basis of image data, the semiconductor light-emitting device including a first conductive layer that includes a current narrowing structure configured such that a current injection area is narrowed and is configured such that a longitudinal direction of the current narrowing structure is provided along one direction from the opposite edge to the light-emitting edge, a second conductive layer, an active layer provided between the first conductive layer and the second conductive layer, and a first electrode layer and a second electrode layer that are respectively provided in contact with the first conductive layer and the second conductive layer, the current narrowing structure including a spread area provided such that a width of the current narrowing structure in a direction along a surface of the first conductive layer widens from a predetermined position toward the light-emitting edge in the one direction, and the first electrode layer including an electrode area that is provided on at least the spread area such that a width thereof in the direction along the surface of the first conductive layer becomes smaller than the width of the spread area.

(12) A display apparatus, including:

a semiconductor light-emitting device including a light-emitting edge and an opposite edge opposite thereto; and an image generation unit that is capable of 2-dimensionally scanning light emitted from the semiconductor light-emitting device and controlling luminance obtained by the light projected, on the basis of image data, the semiconductor light-emitting device including a first conductive layer that includes a current narrowing structure configured such that a current injection area is narrowed and is configured such that a longitudinal direction of the current narrowing structure is provided along one direction from the opposite edge to the light-emitting edge, a second conductive layer, an active layer provided between the first conductive layer and the second conductive layer, and a first electrode layer and a second electrode layer that are respectively provided in contact with the first conductive layer and the second conductive layer, the current narrowing structure including a first area provided from a first position to a second position in the one direction, and a second area that is provided from the second position to the light-emitting edge and includes a width larger than a width of the first area in a direction along a surface of the first conductive layer, and the first electrode layer including an electrode area that is provided on at least the second area such that a width thereof in the direction along the surface of the first conductive layer becomes smaller than the width of the second area.

REFERENCE SIGNS LIST 11, 211, 311, 411, 511 first electrode layer
11a, 311a, 411b linear electrode area
11b, 311b, 411c spread electrode area
13 first conductive layer
14 second conductive layer
20 active layer
32, 232, 332, 432, 532 current narrowing structure
32a, 332a, 432b, 532a linear area
32b, 432b, 532b spread area
33 light-emitting edge
35 opposite edge
70 image generation unit
100 SLD
200 display apparatus
332b, 432c rectangular area
411a first spread electrode area
411c second spread electrode area
432c rectangular area

The invention claimed is:

1. A semiconductor light-emitting device, comprising:
a light-emitting edge;
an opposite edge opposite to the light-emitting edge;
a first conductive layer that includes a current narrowing structure,
wherein a longitudinal direction of the current narrowing structure is along a first direction from the opposite edge to the light-emitting edge;
a second conductive layer;
an active layer between the first conductive layer and the second conductive layer;
a first electrode layer; and
a second electrode layer in direct contact with the second conductive layer,
wherein
the current narrowing structure includes a spread area such that a width of the spread area in a second direction widens from a specific position towards the light-emitting edge in the first direction,
the second direction is along a surface of the first conductive layer,
an entire width, in the second direction, of a surface of the first electrode layer is in contact with the first conductive layer,
the first electrode layer includes an electrode area on at least the spread area such that a width of the electrode area in the second direction along the surface of the first conductive layer is smaller than the width of the spread area,
the active layer includes an optical waveguide, and
the width of the electrode area is smaller than a width that is $1/e^2$ a peak intensity of light that passes the optical waveguide.

2. The semiconductor light-emitting device according to claim 1, wherein the electrode area of the first electrode layer is a spread electrode area such that the width of the electrode area widens toward the light-emitting edge in the first direction.

3. The semiconductor light-emitting device according to claim 1, wherein an edge of the electrode area in the first direction extends toward the light-emitting edge.

4. The semiconductor light-emitting device according to claim 1, wherein
the current narrowing structure includes an area from the opposite edge to the specific position, and
the area includes a constant width that is smaller than the width of the spread area.

5. The semiconductor light-emitting device according to claim 1, wherein the spread area extends from the opposite edge to the light-emitting edge.

6. The semiconductor light-emitting device according to claim 1, wherein
the active layer includes the optical waveguide below the spread area, θ=arctan[λ/(πw₀n)], the θ is a spread angle of the optical waveguide,
λ is an optical wavelength,
w₀ is ½ a minimum width of the spread area in the second direction along the surface, and
n is a refractive index of the active layer.

7. A semiconductor light-emitting device, comprising:
a light-emitting edge;
an opposite edge that is opposite to the light-emitting edge;
a first conductive layer and a second conductive layer;
an active layer that includes an optical waveguide, wherein
a longitudinal direction is along a first direction from the opposite edge to the light-emitting edge, and
the active layer is between the first conductive layer and the second conductive layer; and
a first electrode layer and a second electrode layer that is on the second conductive layer,
wherein
the optical waveguide of the active layer includes a spread area such that a width of the spread area in a second direction along a surface of the active layer widens from a specific position toward the light-emitting edge in the first direction,
the second direction is along a surface of the first conductive layer,
an entire width, in the second direction, of a surface of the first electrode layer is in contact with the first conductive layer,
the first electrode layer includes an electrode area on at least the spread area such that a width of the electrode area in the second direction along the surface of the active layer is smaller than the width of the spread area,
the active layer includes an optical waveguide, and
the width of the electrode area is smaller than a width that is 1/e² a peak intensity of light that passes the optical waveguide.

8. A display apparatus, comprising:
a semiconductor light-emitting device that includes a light-emitting edge and an opposite edge that is opposite to the light-emitting edge,
wherein the semiconductor light-emitting device is configured to emit light; and
an image generation unit configured to:
2-dimensionally scan the light emitted from the semiconductor light-emitting device; and
project, as image data, the scanned light on at least one of an irradiation surface or a wall surface; and
control luminance based on the image data, wherein
the luminance is based on the projected light, and
the semiconductor light-emitting device further includes:
a first conductive layer that includes a current narrowing structure, wherein a longitudinal direction of the current narrowing structure is along a first direction from the opposite edge to the light-emitting edge,
a second conductive layer,
an active layer between the first conductive layer and the second conductive layer,
a first electrode layer, and
a second electrode layer that is in direct contact with the second conductive layer,
wherein
the current narrowing structure includes a spread area such that a width of the spread area in a second direction along a surface of the first conductive layer widens from a specific position towards the light-emitting edge in the first direction,
the second direction is along a surface of the first conductive layer,
an entire width, in the second direction, of a surface of the first electrode layer is in contact with the first conductive layer,
the first electrode layer includes an electrode area on at least the spread area such that a width of the electrode area in the second direction along the surface of the first conductive layer is smaller than the width of the spread area,
the active layer includes an optical waveguide, and
the width of the electrode area is smaller than a width that is 1/e² a peak intensity of light that passes the optical waveguide.

* * * * *